United States Patent
Yoshida et al.

[11] Patent Number: 6,115,116
[45] Date of Patent: Sep. 5, 2000

[54] WAVEGUIDE-TYPE VARIABLE-SENSITIVITY SEMICONDUCTOR PHOTODETECTOR

[75] Inventors: Junji Yoshida; Noriyuki Yokouchi; Takeharu Yamaguchi, all of Kanagawa; Kazuaki Nishikata, Tokyo, all of Japan

[73] Assignee: The Furukawa Electric Co., Ltd., Tokyo, Japan

[21] Appl. No.: 09/134,344

[22] Filed: Aug. 14, 1998

[30] Foreign Application Priority Data

Aug. 15, 1997 [JP] Japan .................................. 9-220308

[51] Int. Cl.$^7$ .................................................. H01L 31/00
[52] U.S. Cl. ...................... 356/214.1; 250/216; 257/184; 385/12
[58] Field of Search ................................ 250/214.1, 216, 250/214 R; 257/184, 431, 432, 464; 385/12, 14, 15, 131, 132

[56] References Cited

U.S. PATENT DOCUMENTS 5,973,339 10/1999 Yokouchi et al. ..................... 257/184

OTHER PUBLICATIONS

D.Meglio et al.; Analysis and Optimization of InGaAsP Electro–Absorption Modulators; IEEEJ and Quantum–Electron 31 pp. 261–268, 1995 (Month Unknown).

*Primary Examiner*—Que T. Le
*Attorney, Agent, or Firm*—Helfgott & Karas, PC.

[57] ABSTRACT

A waveguide-type variable-sensitivity semiconductor photodetector has a waveguide photodetector area and an optical attenuation area formed on an n-InP substrate. The optical attenuation area includes a GaInAs optical waveguide layer having a bandgap energy of 0.85 eV, a pair of upper and lower cladding layers each having a bandgap energy of 1.35 eV and an intermediate layer disposed at the heterojunction interface between the optical waveguide layer and the upper cladding layer and having a bandgap energy of 1.0 eV. A pile-up of halls at the heterojunction interface is prevented by the intermediate layer to improve the linearity of the output optical signal to the input optical signal.

4 Claims, 5 Drawing Sheets

WAVEGUIDE-TYPE VARIABLE-SENSITIVITY SEMICONDUCTOR PHOTODETECTOR

BACKGROUND OF THE INVENTION (a) Field of the Invention

The present invention relates to a waveguide-type variable-sensitivity semiconductor photodetector and, more particularly, to a semiconductor photodetector suitable for use in an optical communication system, which is capable of generating an output signal having an excellent linearity to a large-amplitude input optical signal, thereby achieving a wide dynamic range for the input signal.

(b) Description of the Related Art

It is important to provide a photodetector capable of obtaining a constant amount of photocurrent without depending on the magnitude of the incident light, that is, generating an output signal having an excellent linearity to a large-amplitude input optical signal. Such a photodetector can achieve low fabrication costs for optical modules generally used in public optical communication systems. A waveguide-type variable-sensitivity semiconductor photodetector (referred to as simply variable-sensitivity photodetector, hereinafter) is proposed which is capable of theoretically obtaining the constant amount of photocurrent by optical absorption.

The variable-sensitivity photodetector of the type as mentioned above generally comprises a waveguide photodetector area and a variable-sensitivity waveguide area disposed as the input stage of the waveguide photodetector area. It is proposed that the variable-sensitivity waveguide area be implemented by an optical attenuator for attenuating the magnitude of input optical signals. The optical attenuator has a function for increasing the optical absorption in the optical waveguide area depending on the reverse-bias voltage to thereby reduce the optical input received in the waveguide photodetector area.

Referring to FIG. 1, a conventional variable-sensitivity photodetector 40 has a waveguide photodetector area 12, and an optical attenuation area or variable-sensitivity waveguide area 14 disposed as the input stage of the waveguide photodetector area 12 and having a function of reducing the optical input received in the photodetector area 12. The variable-sensitivity photodetector 40 has a layer structure wherein an InP lower optical confinement layer (or cladding layer) 18, an optical waveguide layer 20, an InP upper cladding layer 22, and a GaInAs contact layer 24 are consecutively formed on an n-InP substrate 16. The photodetector area 12 and the optical attenuation area 14 are electrically separated by a slit-like separation groove 26 for dividing the contact layer 24 into two parts, on which separate top p-electrodes 28a and 28b are formed. The optical waveguide layer 20 including layers 20a and 20b in both the areas 12 and 14 has different thickness between the layers 20a and 20b. A bottom n-electrode 30 formed on the bottom of the substrate 16 is common to both the areas 12 and 14 and is grounded.

The optical waveguide layer 20b in the optical attenuation area 14 is made of a semiconductor material having a bandgap energy larger than the optical waveguide layer 20a in the photodetector area 12 has, and is formed as a transparent waveguide having a small optical absorption rate, which can be practically neglected, against the operative wavelength for the photodetector area 12.

In a general heterojunction structure, wherein two semiconductor layers made of different materials are in contact with each other, the conduction band and the valence band involve distortions therein to have an equal Fermi-level in the bandgap diagram, which causes a band discontinuity at the heterojunction interface therebetween. The band discontinuity, especially in the p-type valence band, involves large spikes, which accumulate or pile-up halls generated by excitation due to optical absorption at the heterojunction interface in a photodetector or optical modulator. This phenomenon is reported as "hall pile-up effect" in IEEEJ and Quantum-Electron 31 pp.261–268, 1995 by D. Meglio et al, for example.

Hall pile-up caused to lower the electric field applied to the optical waveguide layer in the variable-sensitivity waveguide area, degrading the linearity of the output optical signal to the input optical signal. This results from the fact that a larger amount of incident light reduces the absorption coefficient of the photodetector.

The conventional variable-sensitivity photodetector, such as an integrated waveguide-type attenuator, generally has a heterojunction structure between the optical waveguide layer and the cladding layer. As a result, the conventional variable-sensitivity photodetector is liable to the adverse effect by the pile-up of holes in the variable-sensitivity waveguide area, which renders difficult to achieve the linearity of the output optical signal to the input optical signal. Thus, the output characteristics of the variable-sensitivity photodetector as to distortion characteristics are deteriorated to make it difficult to achieve low cost optical modules for use in a public optical communication system.

SUMMARY OF THE INVENTION

It is therefore an object of the present invention to provide a variable-sensitivity photodetector for use in a public optical communication system, which is capable of suppressing the adverse effect by the pile-up of halls to achieve an output signal having an excellent linearity to the input optical signal in a wide dynamic range, thereby obtaining a low cost module for use in the public optical communication system.

The present invention provides a waveguide-type variable-sensitivity photodetector comprising a waveguide photodetector area and an optical attenuation area disposed as the input stage of the waveguide photodetector area, the optical attenuation area including an optical waveguide layer, a pair of optical confinement layers sandwiching therebetween the optical waveguide layer, and an intermediate layer disposed between the optical waveguide layer and one of the optical confinement layers, the intermediate layer having elements same as elements in the optical waveguide layer and a bandgap energy which is between bandgap energies of the optical waveguide layer and the one of the optical confinement layers.

In accordance with the present invention, the pile-up of halls due to spikes in the bandgap energy generated at the heterojunction interface is prevented by the intermediate layer which has the bandgap energy between the bandgap energies of the optical waveguide layer and the one of the optical confinement layers, thereby alleviating the band discontinuity at the heterojunction interface between the optical waveguide layer and the one of the optical confinement layers.

The above and other objects, features and advantages of the present invention will be more apparent from the following description, referring to the accompanying drawings.

PREFERRED EMBODIMENTS OF THE INVENTION

Figure 1:
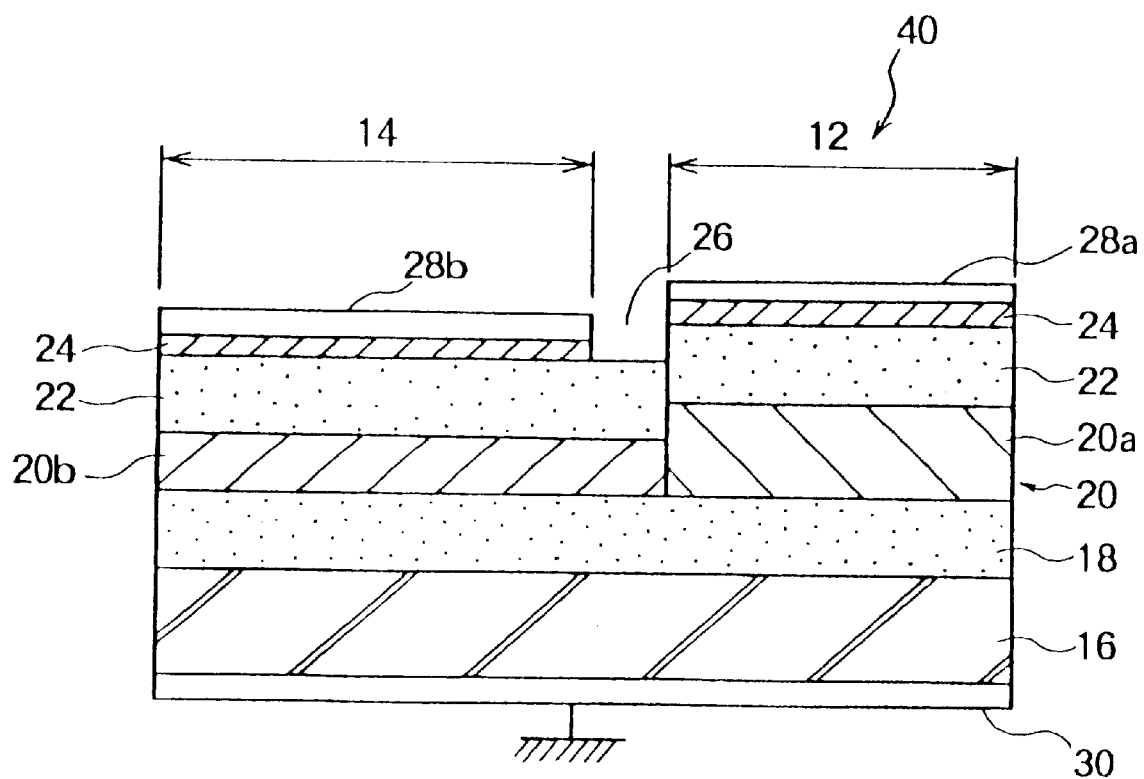
FIG. 1 is a schematic cross-sectional view of a conventional variable-sensitivity photodetector.
Figure 2:
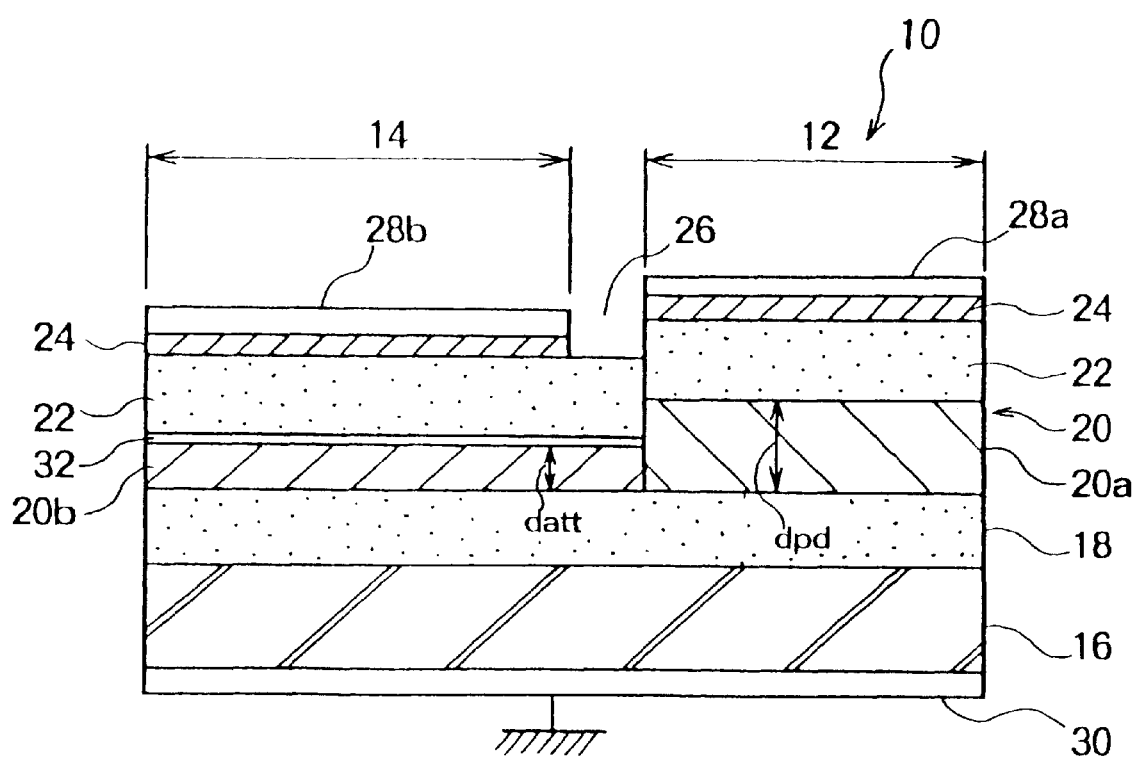
FIG. 2 is a schematic cross-sectional view of a variable-sensitivity photodetector according to an embodiment of the present invention.

Now, the present invention is more specifically described with reference to accompanying drawings, wherein similar constituent elements are designated by similar reference numerals. Referring to FIG. 2, a semiconductor variable-sensitivity photodetector according to an embodiment of the present invention has a monolithic structure wherein a waveguide photodetector area 12 and an optical attenuation area 14 are integrated along the optical axis, with the optical attenuation area 14 disposed as the input stage of the photodetector area 12. In the variable-sensitivity waveguide area 14, a reverse bias voltage (Vatt) is applied to increase the absorption coefficient by the Franz-Keldysh effect in the variable-sensitivity waveguide area 14, thereby attenuating the light quantity of the optical signal received by the photodetector area 12.

The layer structure of the variable-sensitivity photodetector 10 is such that a 2 μm-thick InP lower cladding layer 18, a combinational optical waveguide layer 20, a 2 μm-thick InP upper cladding layer 22 having a bandgap energy of 1.35 eV, and a 0.3 μm-thick GaInAs contact layer 24 are formed consecutively on an n-InP substrate 16. The photodetector area 12 and the optical attenuation area 14 are separated by a slit-like separation groove 26 dividing the contact layer 24 into two parts, on which separate top p-electrodes 28a and 28b are formed. A common n-electrode 30 is formed on the bottom of the substrate 16 and is grounded. The optical waveguide layers 20a and 20b of the combinational optical waveguide layer 20 have different thicknesses, which cause different heights of the InP upper cladding layer 22.

The combinational optical waveguide layer 20 includes a GaInAsP layer 20b, in the optical attenuation area 14, having a thickness (datt) of 0.8 μm and a bandgap energy of 0.85 eV, and a GaInAs layer 20a, in the photodetector area 12, having a thickness (dpd) of 1.5 μm. The GaInAsP waveguide layer 20b in the optical attenuation area 14 has a bandgap energy larger than the GaInAs waveguide layer 20a in the photodetector area 12 has, and is a transparent waveguide having a small optical absorption, which can be practically neglected, against the operative wavelength of the photodetector area 12.

The upper cladding layer 22 and the optical waveguide layers 20a or 20b form semiconductor a heterojunction interface to cause discontinuities in the energy band at the heterojunction interface. Especially in the valence band, the band discontinuity generally involves spikes, which accumulate or pile-up halls that are generated by optical excitation. The magnitudes of the electric fields applied to the GaInAsP waveguide layer 20b and the GaInAs waveguide layer 20a may be reduced to degrade the linearity of the output optical signal to the input optical signal. Accordingly, it is generally difficult in the conventional technique to achieve a photodetector having an excellent linearity of the output optical strength to the incident optical strength, a wide dynamic range and a lower distortion.

In view of the above, in the optical attenuation area 14 of the variable-sensitivity photodetector 10 according to the present embodiment, as shown in FIG. 2, a 5 nm (nanometers)-thick GaInAsP semiconductor intermediate layer 32 having a bandgap energy of 1.0 eV (electron-volts) is disposed at the interface between the upper InP cladding layer 22 having a bandgap energy of 1.35 eV and the GaInAsP optical waveguide layer 20b having a bandgap energy of 0.85 eV, for alleviating the discontinuity of the energy band at the heterojunction interface.

Figure 3A:
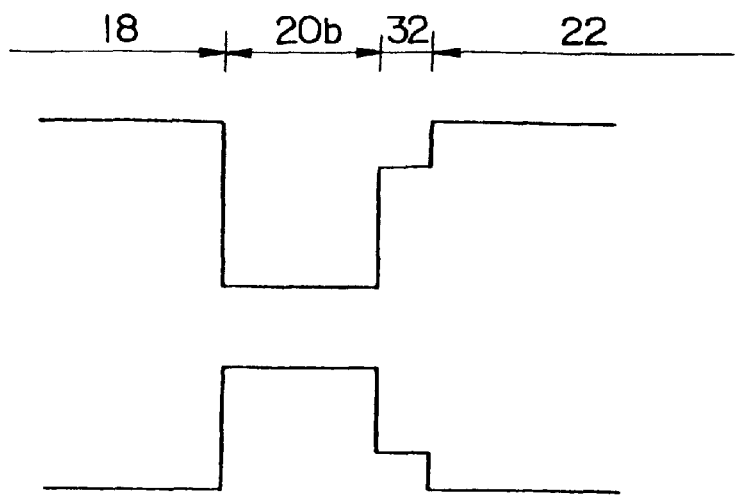
FIGS. 3A, 3B and 3C are bandgap diagrams of the optical attenuation areas of the variable-sensitivity photodetectors of FIG. 2, of a modified embodiment and of FIG. 1, respectively.

Referring to FIG. 3A, the bandgap diagram of the optical attenuation area 14 has a step discontinuity at the GaInAsP semiconductor middle layer 32, the step discontinuity alleviating the discontinuity appearing at the heterojunction interface between the optical waveguide layer 20b and the upper cladding layer 22.

The variable-sensitivity photodetector 10 according to the present embodiment can be formed by using a metal-organic chemical vapor deposition (MOCVD) system, a molecular beam epitaxial (MBE) growth system, an actinic epitaxial growth system etc.

If the variable-sensitivity photodetector 10 is to be formed on a p-InP substrate in the conventional technique, there is a problem of non-linearity of the output optical signal to the input optical signal, resulting from the pile-up of halls on the heterojunction interface between the lower InP cladding layer 18 and the optical waveguide layer 20a or 20b. The present invention can provide a semiconductor variable-sensitivity photodetector, formed on a p-InP substrate as well, having an excellent linearity to the incident light, a wide dynamic range and low distortion characteristics, by disposing the intermediate layer between the lower cladding layer and the optical waveguide layer in the optical attenuation area.

Figure 3B:
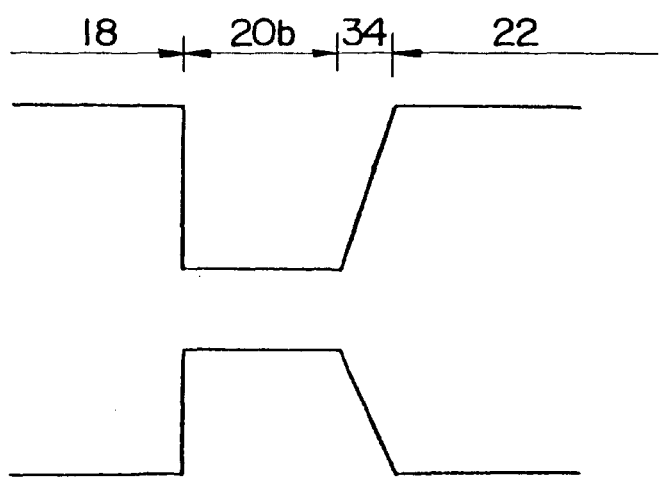

A modification can be made from the above embodiment for achieving a different alleviation on the discontinuity of the energy band of the heterojunction interface. The modification has, instead of the semiconductor intermediate layer 32 having a step discontinuity in the bandgap energy and disposed in the variable-sensitivity photodetector 10 of FIG. 2, a graded-composition layer 34 having a graded-composition material corresponding to bandgap energies from 0.85 eV to 1.35 eV. FIG. 3B shows the bandgap diagram of the optical attenuation area 14 having the graded-composition layer 34. The bandgap energy shown therein alleviates the discontinuity at the heterojunction interface by an inclined line.

Figure 3C:
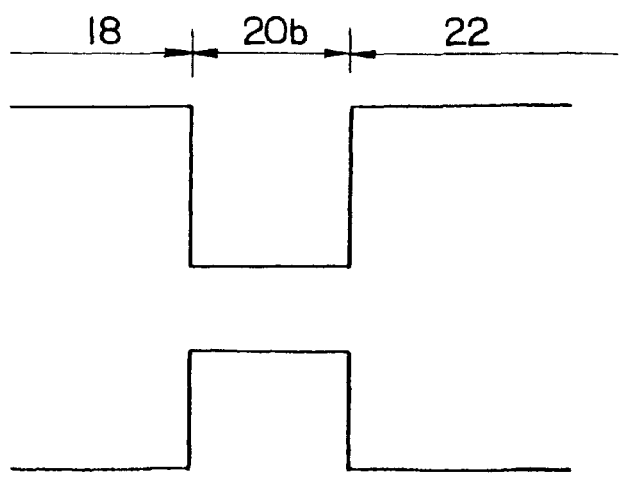

For comparison, FIG. 3C shows a bandgap diagram of a conventional variable-sensitivity photodetector having the layer structure shown in FIG. 2, which does not have the intermediate layer therein, at the interface between the optical waveguide layer and the 20b and the upper cladding layer 22. The bandgap energy shown in FIG. 3C has a sharp step at the heterojunction interface which generally involves small spikes as recited before.

For experimentally evaluating the advantages of the present invention, three samples for variable-sensitivity photodetectors according to the embodiment, the modified embodiment and the conventional technique were fabricated and subjected to tests wherein input optical power (Pin) dependency of photocurrent (Ipd) in the respective samples were examined, with an incident wavelength of 1.55 μm, and with reverse bias voltages Vatt of 0 volt and 8 volts applied to the optical absorption area 14.

Figures 4, 5:
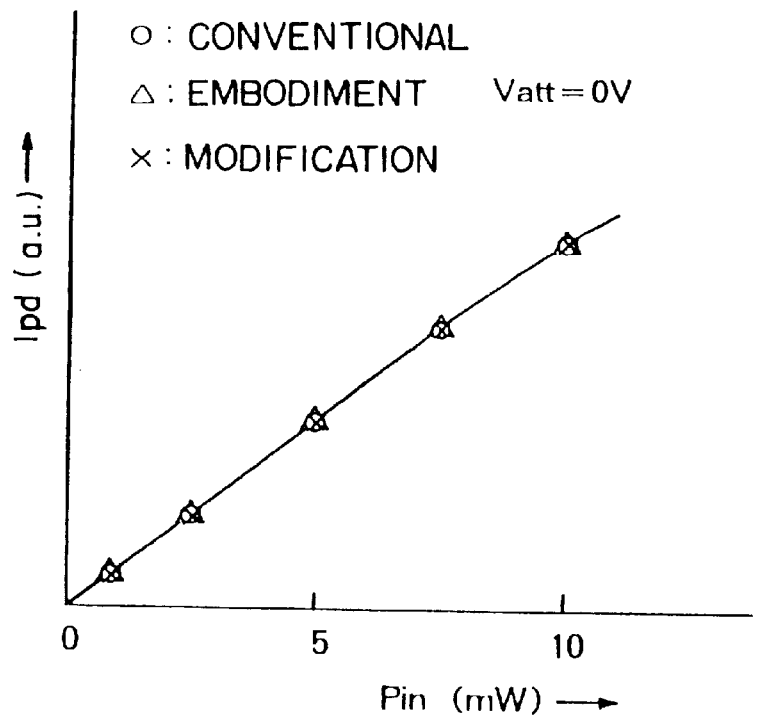
FIG. 4 is a graph showing input optical power (Pin) dependency of photocurrent (Ipd), with an input wavelength of 1.55 μm and an applied voltage Vatt=0V, in the optical attenuation area.
FIG. 5 is a graph showing input optical power (Pin) dependency of photocurrent (Ipd), with an input wavelength of 1.55 μm and an applied voltage Vatt=8V, in the optical attenuation area.

FIG. 4 shows the test results in the relationship of the input optical power Pin and the photocurrent Ipd for the case of applied voltage (Vatt) of 0 volt. As understood from FIG. 4, all the three devices exhibited an excellent linearity of Ipd to Pin for Pin<10 mW and for Vatt=0. Since, in the three devices, the electric field is not applied to the optical attenuation area 14 which is substantially transparent against a wavelength of 1.55 μm, the incident light is detected as it is in the photodetector area 12 as an output photocurrent.

FIG. 5 shows the test results in the relationship of the input optical power Pin and the photocurrent Ipd for the case of Vatt=8 volts. As understood from FIG. 5, the conventional device cannot exhibit an excellent linearity of Ipd to Pin for Pin<1 mW. On the other hand, the variable-sensitivity photodetector according to the embodiment exhibits an excellent linearity for Pin≦6 mW. The photodetector of the modified embodiment having the graded-composition also exhibits an excellent linearity for Pin≦10 mW. FIG. 5 reveals the fact that the pile-up of halls at the heterojunction interface between the upper InP cladding layer 22 and the GaInAsP waveguide layer 20b in the optical attenuation area 12 can be suppressed by disposing the intermediate layer 32 or 34. It also reveals that the graded-composition layer 34 is superior to the GaInAsP intermediate layer 32 as to the linearity of the output optical signal.

Samples of the variable-sensitivity photodetector according to the embodiment were fabricated and subjected to the tests as to how the thickness of the semiconductor intermediate layer 32 affects the relationship between Ipd and Pin. In the tests, Pin dependency of Ipd was examined with the thickness of the intermediate layer 32 at 1 nm, 2 nm, 5 nm, 10 nm and 100 nm for Vatt=8V. A single GaInAsP layer having a bandgap energy of 1.0 eV is used as the intermediate layer 32.

Figure 6:
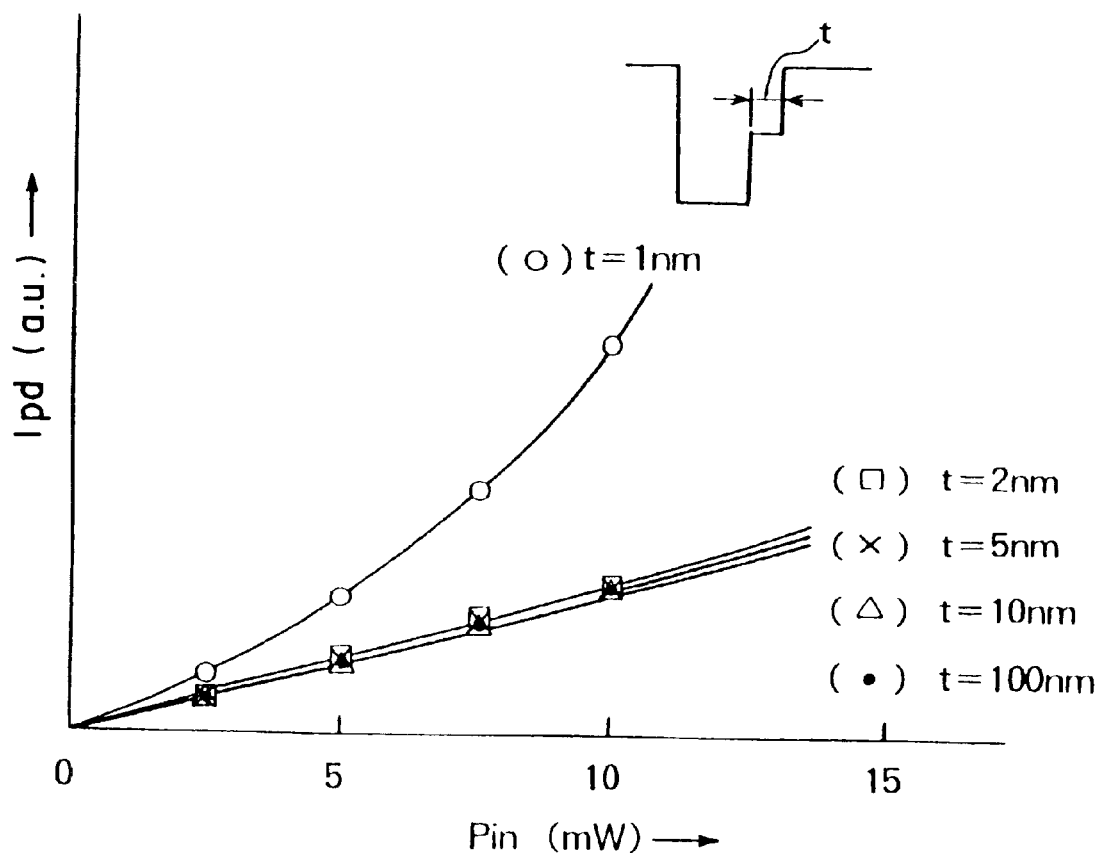
FIG. 6 is a graph showing input optical power (Pin) dependency of photocurrent (Ipd), with different thicknesses for the intermediate layer shown in FIG. 2

The test results are shown in FIG. 6, wherein an excellent linearity of Ipd to Pin was obtained for Pin<10 mW if t<5 nm, and it is difficult to maintain the excellent linearity for Pin>5 mW if t<2 nm. This is attributable to the fact that the smaller thickness of the intermediate layer 32 has little effect to suppress the pileup of halls in the intermediate layer. An excellent linearity of Ipd to Pin was obtained until the thickness of the semiconductor middle layer exceeds 100 nm. In view of the above, it is preferable to make the thickness (t) of the intermediate layer 32 not lower than 2 nm for suppressing the pile-up of halls. The similar situation applies to the graded-composition intermediate layer 34.

In the above embodiment, the GaInAsP waveguide layer 20b and associated layers are exemplarily used in the variable-sensitivity photodetector 10. The present invention is also applicable to variable-sensitivity photodetectors having AlGaAs, AlGaInP, AlGaInN and AlGaInAsPN waveguide layers and associated layers.

Since the above embodiments are described only for examples, the present invention is not limited to the above embodiments and various modifications or alterations can be easily made therefrom by those skilled in the art without departing from the scope of the present invention.

What is claimed is:

1. A waveguide-type variable-sensitivity semiconductor photodetector comprising a waveguide photodetector area and an optical attenuation area disposed as the input stage of the waveguide photodetector area, said optical attenuation area including an optical waveguide layer, a pair of optical confinement layers sandwiching therebetween said optical waveguide layer, and an intermediate layer disposed between said optical waveguide layer and one of said optical confinement layers, said intermediate layer having elements same as elements in said optical waveguide layer and a bandgap energy which is between bandgap energies of said optical waveguide layer and said one of said optical confinement layers.

2. A waveguide-type variable-sensitivity semiconductor photodetector as defined in claim 1, wherein said intermediate layer has a thickness not smaller than 2 nanometers.

3. A waveguide-type variable-sensitivity semiconductor photodetector as defined in claim 1, wherein said intermediate layer is made of a graded-composition material corresponding to bandgap energies continuously increasing as viewed from said optical waveguide layer toward said one of said optical confinement layers.

4. A waveguide-type variable-sensitivity semiconductor photodetector as defined in claim 3, wherein said intermediate layer has a thickness not smaller than 2 nanometers.

* * * * *